(12) United States Patent
Mattheis et al.

(10) Patent No.: US 10,228,267 B2
(45) Date of Patent: Mar. 12, 2019

(54) MAGNETIC SENSOR FOR ABSOLUTE COUNTING OF REVOLUTIONS OR LINEAR DISTANCES

(71) Applicants: Horst Siedle GmbH & Co. KG, Furtwangen (DE); Leibniz-Institut Fuer Photonische Technologien E.V., Jena (DE)

(72) Inventors: Roland Mattheis, Jena (DE); Marco Diegel, Jena (DE)

(73) Assignees: Horst Siedle GmbH & Co. KG, Furtwangen (DE); Leibniz-Institut fuer Photonische Technologien e.V., Jena (DE)

( * ) Notice: Subject to any disclaimer, the term of this patent is extended or adjusted under 35 U.S.C. 154(b) by 440 days.

(21) Appl. No.: 15/034,510

(22) PCT Filed: Nov. 3, 2014

(86) PCT No.: PCT/DE2014/000560
§ 371 (c)(1),
(2) Date: May 4, 2016

(87) PCT Pub. No.: WO2015/062573
PCT Pub. Date: May 7, 2015

(65) Prior Publication Data
US 2016/0265941 A1  Sep. 15, 2016

(30) Foreign Application Priority Data
Nov. 4, 2013 (DE) .................. 10 2013 018 680

(51) Int. Cl.
*G01D 5/16* (2006.01)
*G01D 5/14* (2006.01)
*G01R 33/09* (2006.01)

(52) U.S. Cl.
CPC ............... *G01D 5/16* (2013.01); *G01D 5/145* (2013.01); *G01R 33/093* (2013.01); *G01R 33/098* (2013.01)

(58) Field of Classification Search
CPC ........ G01D 5/16; G01D 5/145; G01R 33/093; G01R 33/098
See application file for complete search history.

(56) References Cited

U.S. PATENT DOCUMENTS

2007/0030718 A1* 2/2007 Cowburn ........... G11C 19/0808
                                                      365/55
2010/0301842 A1* 12/2010 Mattheis ................ G01D 5/145
                                                    324/207.25
(Continued)

FOREIGN PATENT DOCUMENTS

DE    102008063226     7/2010
DE    102010022611    12/2011
(Continued)

OTHER PUBLICATIONS

Barile, Margherita. "Bijective." From MathWorld—A Wolfram Web Resource, created by Eric W. Weisstein. http://mathworld.wolfram.com/Bijective.html.*

*Primary Examiner* — Huy Q Phan
*Assistant Examiner* — Adam S Clarke
(74) *Attorney, Agent, or Firm* — Norris McLaughlin, P.A.

(57) ABSTRACT

A magnetic sensor for the absolute counting of revolutions or linear distances includes a soft magnetic loop structure, which is populated with a predeterminable number of magnetic domains and provided with GMR or TMR layer assemblies, in which at least two separate coplanar loops having predominantly straight subsegments extending in a rhombus-like arrangement with respect to each other are provided, and the at least two loops are connected to each other via a shared intersecting point, wherein directly in (Continued)

front of each intersecting region in which, and after which, the domains can change from one loop to the neighboring loop, these sections of the loop structure are bent away from the conductor guidance and are curved in a siphon-like manner in this region so as to be directed into the interior of the loop structure, wherein the conductors in respective siphon-like troughs intersect each other perpendicularly.

10 Claims, 5 Drawing Sheets

(56) References Cited

U.S. PATENT DOCUMENTS

| | | | | |
|---|---|---|---|---|
| 2011/0080169 A1* | 4/2011 | Haas | ............... | G01R 33/3415 |
| | | | | 324/309 |
| 2014/0015524 A1* | 1/2014 | Lorenz | ............... | G01R 33/09 |
| | | | | 324/252 |
| 2015/0177344 A1* | 6/2015 | Han | ............... | G01R 33/3628 |
| | | | | 324/322 |
| 2018/0095145 A1* | 4/2018 | Ausserlechner | ....... | G01R 33/07 |

FOREIGN PATENT DOCUMENTS

| | | |
|---|---|---|
| EP | 1740909 | 1/2007 |
| WO | 2005/106395 | 11/2005 |
| WO | 2009/027046 | 3/2009 |

\* cited by examiner

MAGNETIC SENSOR FOR ABSOLUTE COUNTING OF REVOLUTIONS OR LINEAR DISTANCES

BACKGROUND OF THE INVENTION

The invention relates to a magnetic sensor for the absolute counting of revolutions or linear distances, which advantageously can be used in multifaceted fields of technology, and in particular in automotive engineering and in industrial automation.

Sensors for determining an angular position according to various physical principles are used widely. They all have in common that the sensor signal is periodic after 360°, which is to say the sensor cannot distinguish between 10° and 370°. Such sensors are therefore needed for tasks in which the angle must be determined beyond 360°, as is the case with the steering wheel in the automobile, for example, combined with a further sensor, which must be able to detect the number of revolutions. In combination with a revolution counter, it is then possible to distinguish between 10° and 370°. So as to determine the number of revolutions, solutions are known in which the number of revolutions (such as between 1 and 5) can be inferred mechanically via the turn of a spiral having N spiral arms. Other solutions utilize mechanical gears in conjunction with two or more angle sensors. Having knowledge of the construction of the gear and the angular positions of the magnets connected to different wheels of the gear, it is also possible to determine the angle from 0 to 5·360°, for example. All these solutions have in common that they require a mechanism for implementation and as a result they are not non-contact, and thus not wear-free. However, a non-contact solution is necessary for many applications, in particular in automobiles. This could be implemented by determining the angular position at every point in time (permanently) and in this way being able to distinguish a transition from 359° to 360° from an angle of 0°. This requires that the sensor and an associated memory element are permanently supplied with electric energy. This is inconsistent with the requirement in automotive engineering that the determination of the absolute angle in the range of 0° to 5·360°, for example, must also be successful when the onboard electronic system is disconnected from the battery, for example.

The company Posital developed non-contact counting of the number of revolutions that satisfies these requirements in principle (company announcement "Kraftwerk im Encoder . . . " (Power house in the encoder . . . ) www.posital.de). A Hall sensor is used there for determining the angle (0 to 360°). The number of revolutions are measured using what is known as a Wiegand wire. This wire has special magnetic properties that ensure that after every revolution, due to the discharging sudden movement of a magnetic domain wall through a wire that is a few millimeters long, a brief but sufficiently intense voltage pulse is created, which can be written to a ferroelectric random access memory (FeRAM), even without the FeRAM being connected to the battery. This solution thus satisfies the demand for the wear-free and non-contact determination of the number of revolutions and also counts revolutions up to the maximum memory capacity of the FeRAM without the current supply being applied. However, the automobile industry rejects this type of solution because cost-effective production and assembly are not possible given the macroscopic size of the Wiegand wire, and problems exist with electromagnetic compatibility due to the high-resistance input of the FeRAMs.

A further sensor element for counting revolutions that satisfies the above-mentioned requirements is known from EP 1 740 909 B1 (WO 2005/106395). This sensor element has the shape of an elongated spiral having N windings and is composed of a stack of layers that has the giant magnetoresistance (GMR) effect. The GMR layer system of this sensor element is substantially composed of a hard magnetic layer, which defines the reference direction, and a soft magnetic layer, these being separated by a non-magnetic intermediate layer. The outer rotating magnetic field to be detected is strong enough to change the magnetization direction of the soft magnetic layer due to the movement of the domain walls, but it is too weak to change the magnetization direction of the hard magnetic layer, which runs parallel to the straight sections of the elongated spiral. The sensor element thus responds to a rotating magnetic field with a change in resistance, wherein whole and half revolutions are detected in the form of 2N+1 resistance values within the countable range of 0 to N revolutions. Each resistance value is thus bijectively assigned to a half-integral or integral revolution value. The magnetic structure remains unchanged if the magnetic field does not rotate. In the case of a rotation, the magnetization directions change, regardless of whether the resistance value is read out or not. This means that the system detects all changes of the rotating magnetic field even in a current-less or power-less state, and current supply is only needed for read-out, which is to say for determining the resistance.

The disadvantage of such an arrangement is that, due to the memory geometry used (each revolution requires a complete spiral winding), the spiral must be very large geometrically when counting a larger number of revolutions. As a result, the probability increases that defects that occur during production of the spiral will lead to failure, and thus to a reduction in the yield. In addition, the chip surface area increases, and along with it the costs for such a sensor. Moreover, when the number of spiral windings is large, the concept provided in EP 1 740 909 B1 automatically results in problems in determining the number of revolutions. The usable voltage swing, which results from one revolution to the next, is scaled at 1/number of spiral windings. This swing is clearly too small for a reliable evaluation for N> to >>10. One alternative, which is provided in the aforementioned patent, does permit the full magneto-resistance swing at higher numbers of revolution, but likewise has the disadvantage of a long spiral, and the advantage of the large swing comes at the expense that, instead of two electrical contacts, all spiral parts that form a non-closed circuit must each be provided with four electrical contacts, and be read out and processed electrically. Even at N=100, this is four hundred contacts, and thus the circuitry is very complex. The above-described solution entails the added problem that, once the maximum number of domains that can be guided in the spiral conductor is reached, the conductor is entirely populated by domains, and during any further semi-rotation one domain leaves the conductor, while a new one is fed at the same time. This ends the unambiguous nature of the revolution counting at n windings, and thus 2n domains. A directionally reversed revolution of the outer rotating magnetic field ultimately clears the spiral completely of domains, so that unambiguous counting also ceases to be possible in the reverse direction once the maximum detectable revolutions are exceeded.

Eliminating the above-described problems was already the task of one proposal according to WO 2009/027046 A1, in which a magnetic revolution counter for the unambiguous determination of a predefinable number of revolutions to be determined for a rotating element was proposed, in which, depending on the number of revolutions to be measured for the element to be detected that is provided with a magnetic system, the magnetic field of which permits the detection of all provided sensor elements, a plurality of sensor elements are provided, wherein the sensor elements were populated by magnetic domains having a predeterminable and fixed number. According to this proposal, the domains are guided in respective closed loops, which include at least one ferromagnetic and one soft magnetic layer, wherein tapered protuberances oriented into the interior of the loop were assigned to the loops, and the number of protuberances provided per loop is established in a defined manner deviating from each other from loop to loop. With the aid of electrical contact arrangements provided there, which allow the changes in the electrical resistance of predefinable loop sections to be detected after magnetic domains have changed location as a result of the action of the outer rotating magnetic field of the magnet system in the predefined loop sections, it is possible to supply these resistance values to an evaluation unit for the purpose of correlating the number of revolutions of the rotating element. The respective closed loops provided in this proposal can be nested in one another or be disposed adjacent to one another on a substrate. This solution solved the above-described problems of the necessary voltage swing and of the bijectivity of the counting within the predefinable boundaries, while reducing the overall conductor length at the same time. The tapered protuberances required within the scope of this proposal, however, represent considerable requirements with regard to the production technology. The reason is that the cusps must be implemented very precisely and at an angle of less than 15°. If one does not intend to use technologies such as focused ion beam (FIB), which are very complex and consequently also very expensive, the limits on achievable yield will be reached very quickly, at least with larger cusp numbers using standard lithographic technologies. This proposal is therefore only conditionally suited for large inexpensive sensor batches with little waste.

Moreover, another problem exists with the present solution, which is a domain conductor width that is not consistent throughout. In this regard, first the following fact must be pointed out, which applies to all sensors of this type: An upwardly and downwardly limited magnetic field range exists for the magnetic field acting on the sensor, in which reliable functionality of the sensor or system is achieved. Only above a minimum magnetic field (hereafter $H_{min}$) is a domain moved 100% through the structure, and an encounter of two domains reliably prevented, along with the attendant destruction of the same, and thus the undesirable reduction in the number of domains. At the same time, however, the magnetic field must not be so large that magnetic domains are unintentionally created. This means that a magnetic field $H_{max}$ exists, which must not be exceeded. The field range of the sensor must therefore always be above $H_{min}$ and below $H_{max}$. It is advantageous for any intended use of the sensor if $H_{min}$ is very small and $H_{max}$ is also very large, and thus the so-called magnetic window $\Delta H = H_{min} - H_{max}$ is as large as possible. The magnitude of $H_{max}$ is primarily dependent on the cross-section of the portion of the used layer stack in which the magnetic domains move. It is proportional to the thickness thereof, and indirectly proportional to the width thereof. The minimum field depends on the roughness of the layer. At a constant absolute roughness, $H_{min}$ decreases as the width increases.

It is now apparent in the proposal according to WO 2009/027046 A1 that, at the point of convergence at the lower end of a cusp, widening to at least double the domain conductor width is inevitable, resulting in a significant reduction of the upper field $H_{max}$. When further assuming a typical minimally producible radius of curvature at this end of the cusp of 200 nm (which is a typically achievable value for a standard DUV wafer stepper), the width increases to ~600 nm. This widening results in a massive reduction of the upper maximally permissible field of the magnetic window in which the sensor operates. In a first approximation, this value is indirectly proportional to the strip width (here =200 nm), and is thus reduced to a value of ~33% of the value that would in fact be theoretically possible with the strip width of 200 nm.

The latter problem of the effect of varying conductor widths was solved in DE 10 2010 022 611 A1 by using a soft magnetic loop structure that is populated with a predeterminable number of magnetic domains and provided with GMR or TMR layer assemblies, wherein the loop structure is formed of at least two separate loops, which are each spiral-shaped, wherein the respective first inner loop end is connected to the respective second outer loop end of the same loop so as to bridge all the remaining loop sections of the respective loop at a predefinable distance by way of a respective soft magnetic bridge, which thus magnetically closes the respective loop, wherein at least one domain is written into each of the closed loop structures. This solution, which comes closest to the present invention, has a larger magnetic window than the comparable solutions known until then, since it at least allows conductor widths that are consistent throughout to be produced. However, creating the bridges provided there, and thus ensuring uniform thicknesses of the conductors in the step-like transition regions, poses such considerable technological demands that a mass production of such revolution counters is associated with an excessively high scrap rate, and therefore is uneconomical.

In addition to the above-described prior art, reference shall be made to document DE 10 2008 063 226 A1, which describes where and how an effective attachment of read-out contacts is to be carried out using the example of a rhombic spiral structure of domain-guiding conductors. Such deliberations are also used in the invention newly proposed herein, so that this would have to be addressed in greater detail only conditionally here. DE 10 2010 022 611 A1 likewise provides suggestions for an advantageous contact connection for reading out the sensor and for the defined writing of domains into the conductor structures, which can likewise be used analogously in the present invention.

SUMMARY OF THE INVENTION

It is the object of the present invention to provide a magnetic sensor for the absolute counting of revolutions, and partial revolutions, or linear distances, which is technologically easy to produce using commercially available technologies, which has a wider magnetic window than comparable sensors according to the known prior art, and which, maintaining the basic topology, can be used in a simple manner to count arbitrarily predefinable, and in particular high, numbers of revolutions N (such as N>4000), and larger linear distances of 4,000 mm to 20,000 mm, for example, depending on the desired resolution (such as 50 μm to 250 μm).

Within the scope of the invention, layer compositions that are known per se are also used, such as those described in EP 1 740 909 B1 or WO 2009/027046 A1, which allow a domain configuration to be determined, utilizing the known effect that the electric resistance in a GMR or TMR stack is dependent on the relative direction of magnetization of the layer in which the domains move, compared to a reference direction defined by a hard magnetic layer.

Within the scope of the present invention, a novel loop topology is proposed that achieves the object of the invention. The essential advantages of this proposed topology lie in a considerably increased magnetic window in which the magnetic sensor is able to operate, and in the considerable reduction of the requirements with regard to the production thereof.

The novel construction of the proposed sensor will serve to enable the non-contact and current-less counting of high numbers of revolutions on the order of magnitude of 4000, or larger distances on the order of magnitude of 20000 mm, which is of interest for a multitude of technical applications. However, the proposed sensor can also particularly advantageously be used to ascertain low numbers of revolutions, while having the simplest design, such as in automotive engineering for exactly determining cycles of internal combustion engines, and it can, for example together with an angle sensor, assume the function of camshafts and thus replace these expensive components.

The essence of the invention is that at least two separate domain-guiding loops comprising predominantly straight subsections, which extend in a rhombus-like arrangement with respect to each other, are provided, and the at least two loop structures are connected to each other via a shared intersecting point, wherein directly in front of the intersecting region in and after which the domains can change from one into the neighboring loop structure, these sections of the loop structures are bent against the sense of the direction of the conductor guidance and are curved in a siphon-like manner in this region so as to be directed into the interior of the loop structure, wherein the conductors in the respective siphon-like troughs perpendicularly intersect at one point, and all described loop structures are disposed so as to lie in only one shared plane, wherein all domain-guiding loop sections, including the intersecting regions, have substantially the same width. Since with this configuration of the intended intersecting region, which are created in one plane with all other conductor structures in one uniform structuring process, all production problems of comparable sensors according to the known prior art are eliminated, as described above. At the same time, since no acute angles occur in the proposed new topology, which result in undesirable and unavoidable conductor widening, the usable magnetic window is considerably increased. This also results in a noticeable reduction of the requirements with regard to the outer magnetic field driving the domains.

According to the invention, to achieve the object, there is provided a magnetic sensor for ascertaining absolute revolution or displacement values for the bijective determination of a predefinable number of revolutions or partial revolutions, or displacements, to be ascertained of an element that is connected to a magnetic system and generates an anisotropic, external magnetic field, providing drive by way of the rotation and/or locational position of the element, wherein a soft magnetic loop structure, which is populated with a predeterminable number of magnetic domains (D) and provided with GMR or TMR layer assemblies, is used, wherein the loop structure includes at least a first conductor loop and a second conductor loop arranged one within the other in a common plane and predominantly comprises straight subsections which extend in a rhombus-like arrangement with respect to each other, and the at least two loops are connected to each other via a shared intersecting point, and wherein directly in front of each intersecting region, in which and after which the domains (D) can change from one loop to the neighboring loop, the loops further comprise sections bent away from straight subsections contiguous therewith and directed into an interior of the loop structure where the conductors intersect perpendicularly. The term "rhomus" is used herein in a broad sense to encompass a square α well as equilateral parallelograms.

The measuring tasks underlying the present invention, and thus the use of the proposed magnetic sensor, can be found in two basic configurations in technology in the case of the determination of revolutions: either the number of revolutions of a shaft is to be determined, which is accessible from the side (decentralized arrangement or hollow shaft sensor system), or the sensor can be positioned opposite one end of the shaft (central arrangement). In addition, the proposed magnetic sensor can also be used for the absolute determination of linear displacements or partial revolutions with extreme accuracy.

Another significant advantage of the solution according to the invention, in particular from the view of the production technology, is that all domain-guiding loop structures, including intersecting regions that are critical per se (compare to the known prior art), can be formed exclusively in one uniform plane.

BRIEF DESCRIPTION OF THE DRAWINGS

The following exemplary embodiments and figures are provided for a more detailed description of the invention above and hereafter. In the drawings.

DETAILED DESCRIPTION OF THE INVENTION

Figure 1A:
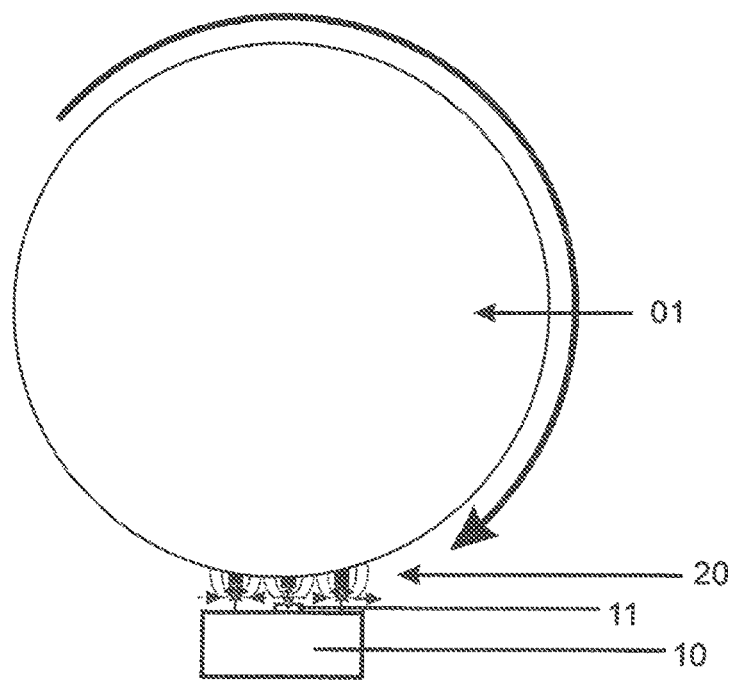
FIG. 1a shows the basic principle of a decentralized sensor arrangement (hollow shaft sensor)
Figure 1B:
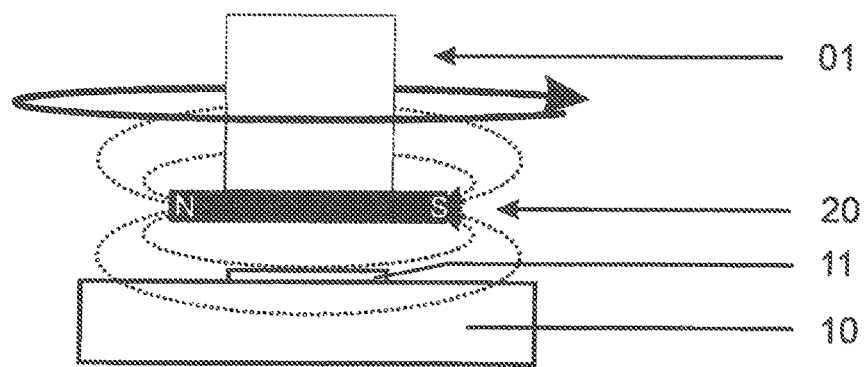
FIG. 1b shows the basic principle of a central sensor arrangement.

FIGS. 1a and 1b show two fundamental arrangements, in which the sensor according to the invention described in greater detail below can be used. FIG. 1a shows a cross-section through an overall system having a decentralized arrangement (hollow shaft sensor arrangement), composed of a shaft 01 having a magnetic system 20 attached on the circumference, made of an Si substrate 10 (advantageously also comprising evaluation electronics) on which a revolution counter 11 according to the invention is located. At the location of the revolution counter 11, a magnetic field acts from the outside, here in the form of a permanent magnet combination 20, which, on moving past, generates a rotation of the direction of the magnetic field by 360° at the location of the revolution counter 11. Since, according to the known prior art, revolution counters are generally operated in conjunction with an angle sensor, which for this reason is not shown in detail here, the location of the rotating magnetic field is known from the signal of the angle sensor.

In an above-mentioned second basic application option, a permanent magnet 20 is attached to the end face of a shaft 01. FIG. 1*b* shows such an embodiment in a cross-sectional view through an overall system having a central arrangement, composed of an Si substrate, advantageously comprising evaluation electronics 10, on which the revolution counter 11 according to the invention is located. At the location of the sensor 11, a magnetic field of a permanent magnet 20 located at the end of the shaft 01 acts from the outside, the permanent magnet being designed so that the entire revolution counter is captured by the aforementioned magnetic field, as the exemplary flux lines are intended to indicate. Upon rotation of the shaft 01 by 360°, the revolution counter 11 likewise experiences a magnetic field rotating 360°. It also applies in this embodiment that there are angular ranges in which the written domain configuration is just undergoing a change, and which would then supply invalid information regarding the number of revolutions. However, if this range is smaller than 90° per half revolution, it is then possible, having knowledge of the angle, which can be determined, for example, by way of an angle sensor used together with the revolution counter or by using a quadrant counter, which is to say an angle sensor that is able to determine the quadrant in which the direction of the rotating permanent magnet is located, to achieve an unambiguous determination of the number of revolutions. This is described in detail in IEEE Trans. Magn. Vol 45, issue 10, pgs. 3792-3795. However, since these additional measures form part of the known prior art, they do not require further explanations within the scope of the present invention.

The domain walls themselves move in the sensor according to the invention in an arrangement, created by way of a structuring process, for example, of multiple loops described in greater detail below, into each of which a defined number of domain walls is written by an initialization process forming part of the prior art. The configuration of these different loops is designed, or selected, so that an arbitrarily predefinable number of outer revolutions always allows bijective counting of the same.

The domain configurations present in this specific case can be determined with the aid of a number of electrical contacts on the loops, based on magnetoresistive effects, such as the giant magnetoresistance (GMR) effect or the tunneling magneto resistance (TMR) effect, and the number of revolutions of a magnetic field that moves the domain walls in the closed loops can thereby be ascertained. This determination of the domain configuration utilizes the known effect that the resistance in a GMR or TMR stack is dependent on the relative direction of magnetization of the layer in which the domains move, compared to a reference direction defined by a hard magnetic layer.

The resistance is low when the direction of magnetization in the reference and sensor layers is the same, and it increases by (6 to 10)% (in the case of the GMR effect), or by (100 to 500)% in the case of the TMR effect, when the direction of the two magnetizations is antiparallel.

Figure 1C:
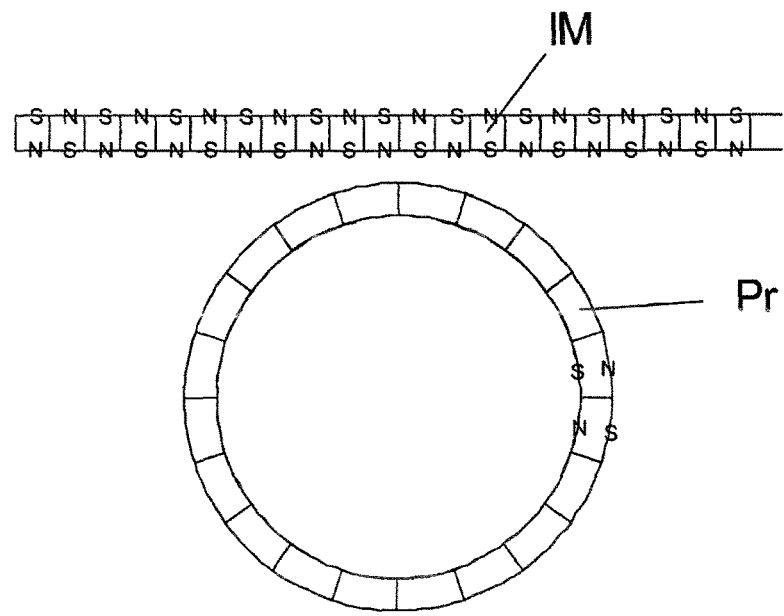
FIG. 1c shows, by way of example, a linear magnetic scale in the upper portion of the figure, and a magnet wheel, opposite which the sensor according to the invention can be disposed in the lower portion.

FIG. 1*c* shows the usage option of a sensor according to the invention in conjunction with a linear magnetic scale IM (see upper portion of FIG. 1*c*) in a schematic representation. Here too, the domains written to the sensor structure shown in greater detail in FIG. 3 experience a movement by this structure when the sensor moves parallel to the scale. If the scale has a pole length of 1 mm, for example, the sensor experiences a complete rotation of the magnetic field by 360° when moving 1 mm. In this way, it is possible to carry out an absolute length measurement. If the sensor counts up to 4096 revolutions, for example, lengths of up to approximately 4000 mm can be measured. The resolution of the length measuring system is determined by the resolution of the goniometer, which is likewise not shown here, assigned to the revolution counter. If this is 0.5°, for example, the pole length of 1 mm can be measured with an accuracy of 0.50/360-0.1 mm~1.4 µm. The bottom illustration in FIG. 1*c* shows a magnet wheel Pr by way of example, which can be used in an arrangement according to FIG. 1*a* and which likewise is composed of alternately disposed and alternatingly oriented magnet segments (analogous to the linear scale), which is indicated only twice in this figure.

Figure 2:
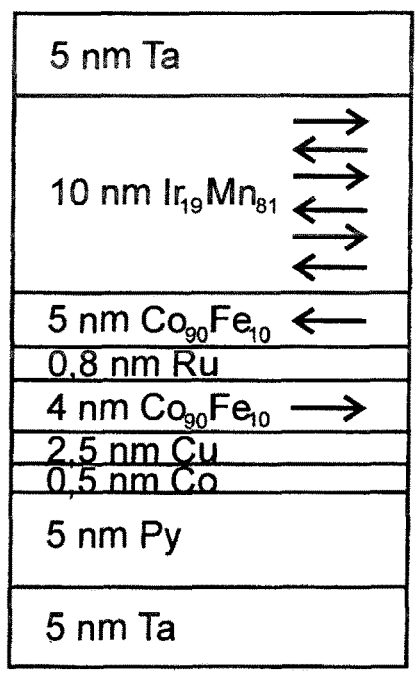
FIG. 2 shows an exemplary layer stack, which can be used to utilize the GMR or TMR effect.

FIG. 2 shows a layer stack by way of example, which is to be used to utilize the GMR or TMR effect. Such a layer assembly, which is known per se, is shown in a cross-sectional view in FIG. 2. For GMR layer systems, the current flows in the direction of the indicated magnetization arrows (in the layer plane); the electric resistance is determined by way of electric contacts (not shown here), which are applied at a large distance (typically up to 200 µm) from each other.

If a TMR stack is used in the present invention, the 2.5 nm thick copper layer shown in FIG. 2 is replaced by a 1 to 2 nm thick $Al_2O_3$ or MgO layer. The current then flows perpendicularly through the layer stack from bottom to top, or vice versa. The TMR stack generally takes up a surface area of a few to several 10 to 100 µm². Further embodiments with special design options for the GMR or TMR layer stacks are unnecessary at this point because these form part of the known prior art per se. For this reason, only the following description is provided hereafter:

A $Ni_{81}Fe_{19}$ (permalloy=Py) layer functions as the actual sensor layer in which the magnetic domains move, wherein the 0.5 nm thick Co layer is only used to amplify the GMR or TMR effect. A combination of a so-called synthetic antiferromagnet (CoFe/0.8 nm Ru/CoFe) in combination with an antiferromagnet (in FIG. 2: IrMn, otherwise also NiMn or PtMN) serves as the hard magnetic layer. The 0.8 nm thick Ru layer ensures that the magnetic moments of the two CoFe layers are oriented antiparallel and ideally cancel each other out. The IrMn in combination with a CoFe layer generates what is known as unidirectional anisotropy. This defines the preferred magnetic direction. This may be uniform in the entire wafer, and thus also in the loops formed according to the invention.

For reliable movement of the domains in the sensor layer, a minimum magnetic field $H_{min}$ is necessary, which is dependent on the geometry (height and width of the sensor layer) and the magnetization of the material of the magnetic soft layer, which is structured in the loop shape according to the invention described in greater detail below. The proposed principle at the same necessitates that the number of domains within the loop does not change during use of the revolution counter. This means that the magnetic field acting on the revolution counter must always be smaller than a magnetic field $H_{muk}$ in which a nucleation of a magnetic region, and thus a generation of additional domain walls, occur; however, this can be easily satisfied by the selection of the magnetic field of the rotating permanent magnet 20 acting on the revolution counter (see FIGS. 1*a* and 1*b*, respectively the linear scale IM or magnet wheel Pr in FIG. 1c). As was already indicated above, however, these requirements are considerably reduced as a result of the novel topology according to the invention, since a considerably larger magnetic window is achievable by the present invention.

All of the above-described stipulations and usage options that already form part of the known prior art apply in the same manner to the novel topologies proposed within the scope of the present invention.

Figure 3:
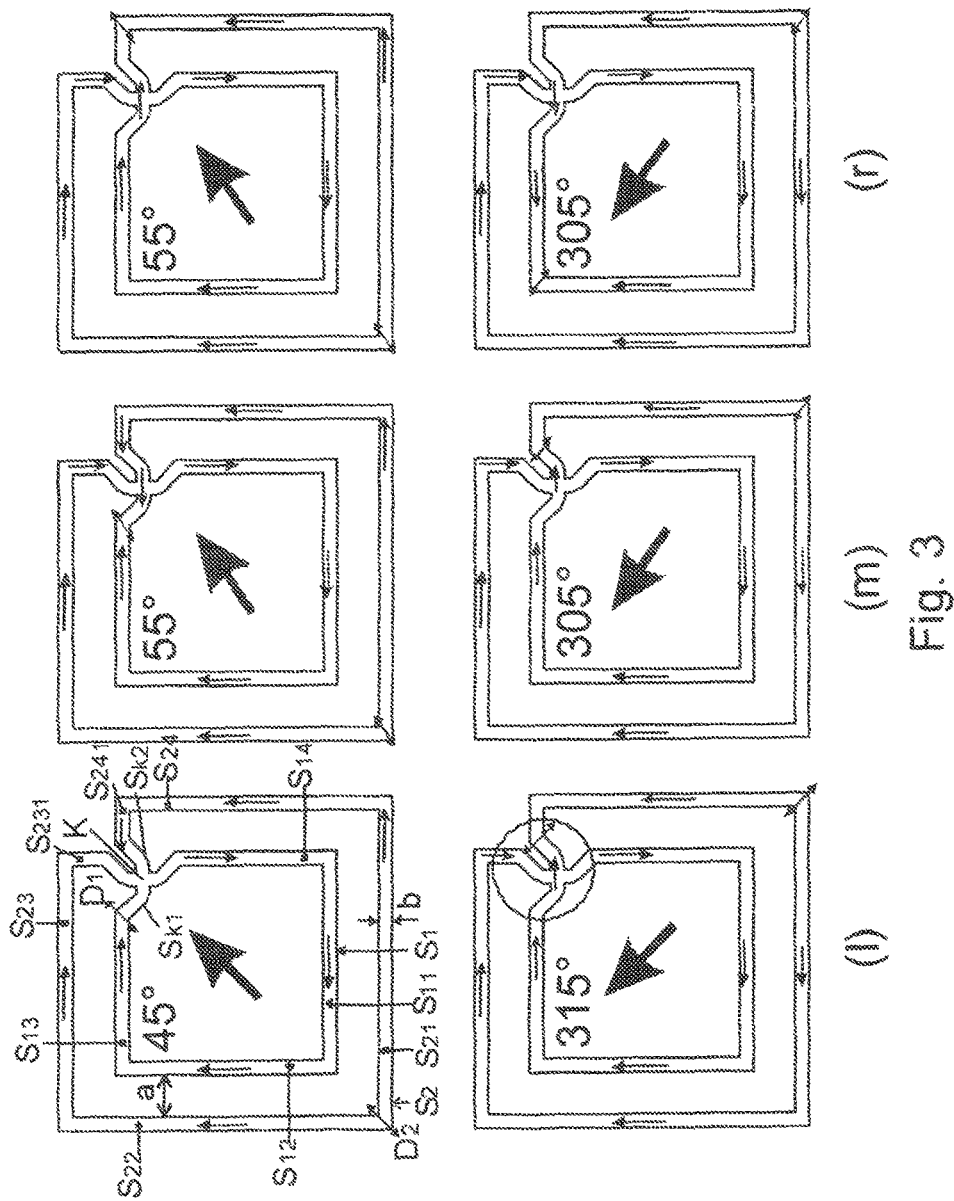
FIG. 3 shows a plan view of a first exemplary embodiment according to the invention of a sensor having a loop configuration shown here including two spirals.
Figure 3A:
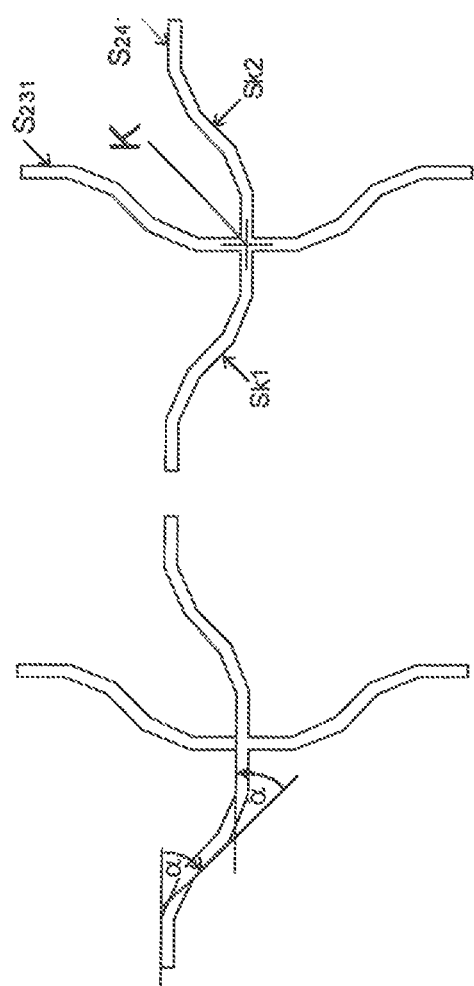
FIG. 3a shows an enlarged illustration of an intersecting region created according to the invention, which connects the two loops according to FIG. 3.

The basic principle of the present invention shall be described in greater detail based on FIG. 3. FIG. 3 shows a basic loop structure, which in the example is composed of two loops $S_1$ and $S_2$ together comprising substantially a spiral. The outer, in the present example rotating (illustrated here by a central fat arrow), magnetic field is applied equally to the two spiral loops (i.e., loops of the spiral). In order to illustrate the topological principles, this figure is not shown to scale, and thus some details are necessarily drastically exaggerated here to render the essence of the present invention visible. To gain an idea of the real configuration, it shall be noted that, in the implemented example, the width d of the conductors guiding the domains D ($D_1$ and $D_2$ here) is 200 nm, while the distance a of the loops from each other is set in the range of 5 to 10 μm, and the total surface area taken up by the rhombic arrangement is approximately 200 μm·200 μm in this example. It is apparent from this alone that an arrangement of sensors, comprising more than two loops or a combination of multiple sensors having varying numbers of loops, is possible on notably small substrate surfaces, so that the outer magnetic field, which is macroscopically clearly larger, can be applied equally to all sensors without difficulty. In FIG. 3, the inner thick arrow indicates the direction of the outer rotating magnetic field, which here is assumed to rotate clockwise in the top three illustrations, and is to be at 45° in the upper left portion of FIG. 3. The thin arrows in the conductors indicate the direction of the local magnetization directions in the conductor sections, while the two domains $D_1$ and $D_2$ written here are represented by a double arrow. FIG. 3 shows the positions of the domains $D_1$ and $D_2$, which these are to have assumed at 45° by way of example. The movement of the domains $D_1$ and $D_2$ in the substantially straight subsections $S_{11}$, $S_{12}$, $S_{13}$, $S_{14}$ and $S_{21}$, $S_{22}$, $S_{23}$, $S^{231}$, $S_{24}$, $S_{241}$, which extend in a rhombus-like arrangement, is not critical here. What is interesting is the course of movement of the domains across the intersection K according to the invention provided in one plane on the substrate. If the entire intersection K were designed to be exclusively rectangular (not shown here), it would be much more likely from an energetic point of view, with further rotation of the outer magnetic field, that the domain wall $D_1$ moves upward than, as is desired, to the right into the loop $S_2$. Bijective counting of the domain revolution across the loops would thus no longer be possible. To prevent this, a novel intersecting region K is provided according to the present invention, which is shown in enlarged form in detail in FIG. 3a. FIG. 3a shows only the section of the area circled in the lower left image of FIG. 3. It is apparent, there, how in and after directly in front of the intersecting region K, the domain $D_1$ can change from the first loop $S_1$ into the neighboring loop $S_2$. For this purpose, a respective structure that is curved in a siphon-like manner in this region so as to be directed into the interior of the loop structure is provided at the intersecting loops $S_1$ and $S^2$, only a short conductor section of the respective troughs being situated perpendicularly on each other within this structure. In FIGS. 3 and 3a, the trough sections of the horizontally extending loop structure are denoted by $S_{k1}$ and $S_{k2}$; the analogously designed sections of the trough sections situated perpendicularly thereto are not denoted in detail. It is important for the functionality of the solution according to the invention that both trough curvatures (which is to say the horizontal trough and the trough situated perpendicularly thereto) point in the direction of the loop interior. It is furthermore essential, that directly in front of to the intersecting region, in which and after which the domains (D) can change from one loop structure into the neighboring loop structure, these sections of the loop structures are bent against the sense of the direction of the conductor guidance and form the proposed siphon-like region. So as to achieve the change in the sense of the direction of the conductor guidance, the bending angle α is provided before the straight conductor sections ($S_{13}$, $S_{241}$ and $S_{14}$, $S_{231}$) approach the trough sections ($S_{k1}$, $S_{k2}$), and in each case is designed to be >45° in absolute terms and smaller than 90° (see FIG. 3a left illustration). The same stipulation applies to the trough section that is mirror symmetrical thereto and to the second trough situated perpendicularly to the first trough, in which the use of additional reference numerals was dispensed with for the sake of clarity.

This bending angle α can generally be selected between >45° and <90°; however, within the scope of the invention it will preferably be selected between >45° and <55° for hysteresis reasons, which are not discussed in greater detail here.

The mode of operation of the siphon-like loop structure sections according to the invention is apparent from FIG. 3 for field angles of 45° and 55° of the outer magnetic field (again represented by thick arrows in the loop structure) in the upper portion of FIG. 3. It is apparent there that a movement of the domain wall ($D_1$ here) through the siphon takes place only at a direction of the outer magnetic field of >45°. At the intersecting point K of the two siphons, the field direction driving the domain $D_1$ is now oriented such that the domain $D_1$ continues in a straight manner (driving field angle is 35°). In contrast, the driving field in the region that is perpendicular thereto is rotated 55° in relation to the intersecting direction. For this reason, it is much more favorable energetically for the domain wall $D_1$ to pass horizontally through the siphon and then carry out the desired movement into the loop $S_2$. In the case of lateral dimensions (i.e., width) of this siphon, which is typically selected between 0.5 μm and 10 μm within the scope of the invention, a domain wall thus maximally requires 25 ns at typical wall movement speeds between 400 to 1000 m/s (with an expansion of the siphon ~10 μm). During this time, the direction of the outer magnetic field must not have changed more than 10°. This stipulation thus allows rotations of up to 10°/25 ns=1 U/μs, which is to say $10^6$ UI/s, to be measured. This is more than sufficient for all conceivable applications in which the sensors according to the invention would be used.

If the domain wall $D_1$ in the example has moved completely through the intersection and the siphon-like region at 55° (as is shown in the top right position of FIG. 3), a back-movement of the domain $D_1$ takes place only when the field angle has dropped significantly below 315°. For energetic reasons, it is then again imperative that the domain wall runs horizontally through the siphon.

The solution according to the invention thus makes it possible to write an intersection into the loop structures, wherein the arrangement of the intersection within a siphon-like modification of the straight regions extending toward the intersection always ensures that the domain crosses the intersection in a straight manner, and does not erroneously migrate into a region of the intersection that is rotated 90° in relation to the existing direction of movement. It has been shown that it is sufficient if the conductor sections of the siphon-like structure which intersect perpendicularly at the point P are oriented perpendicularly to each other in a region that approximately corresponds to the order of magnitude of triple the conductor width b. The bottom three illustrations of FIG. 3 show only the domain movements when the outer magnetic field moves counterclockwise to illustrate that the proposed sensor acts in the same manner in both directions of rotation of the outer magnetic field, regardless of the direction of rotation.

The condition of a two-cycle engine can already be bijectively determined with this simplest design shown in FIG. 3, since a counter that is able to count to 2, in combination with an angle sensor, can determine an angle of 0° to 720°, in absolute terms. At an angle of 720°, this sensor again achieves the 0° position and cyclically repeats the process.

Figure 4:
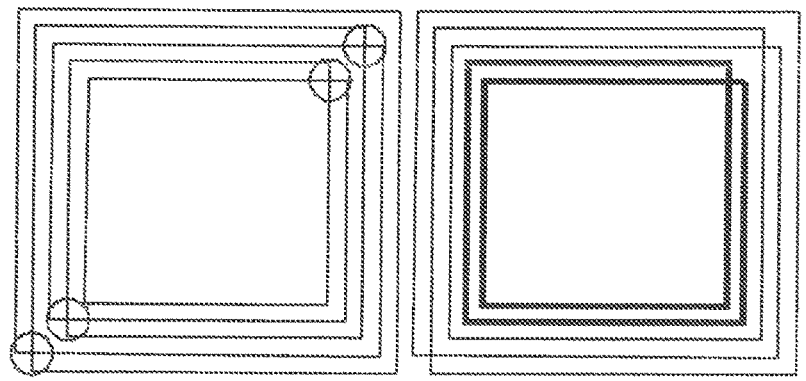
FIG. 4 shows a fundamental exemplary arrangement of a sensor having five loops, combined with double and triple loops packed inside one another.

Within the scope of the invention, however, it is possible to arrange multiple loop structures $S_1$ to $S_n$ that are closed to each other, while maintaining the principle of intersections between neighboring loops proposed herein. This is schematically apparent from the left illustration in FIG. 4 based on the example of a loop structure having five loops, which allows five revolutions to be bijectively detected. It is advantageous with respect to the required electrical contacts to arrange the intersecting regions, which are shown only symbolically here, diagonally over the rhombus-like arrangement shown here, as is indicated by the circles in the left portion of FIG. 4 comprising the respective intersections. For the sake of simplicity, FIG. 4 shows the intersections only symbolically; in terms of their actual design, however, they identically follow the stipulations corresponding to the specific description of FIG. 3. Other arrangements of the intersecting regions in the case of multi-piece loop structures that close only once, however, are expressly within the scope of the invention, as long as the stipulation of the curvatures of the intersecting regions which are directed into the loop interior in a siphon-like manner is met.

In a further embodiment of the invention, however, this is not limited to a single closed multi-loop arrangement. FIG. 4 likewise indicates the principle that generally must be followed for an expansion to multiple, respectively closed loop arrangements, which are all to be disposed in one area in direct vicinity on the same substrate. With the desired advantageous population of each closed loop arrangement with the respective two domains, FIG. 4 on the left shows a loop arrangement comprising five loops, and to the right thereof shows, by way of example, a loop arrangement composed of an inner 2-loop arrangement and a 3-loop arrangement surrounding the same which are nested inside each other. All described loop arrangements are, as described above, each populated with two domains, so that upon a rotation of the outer magnetic field, which is not shown in FIG. 4, it is possible to bijectively count 2·3·5=30 revolutions. In the adaptation to a predefinable number of revolutions to be measured, or in an expansion to high numbers of revolutions, as is already apparent from the above clear example for 30 revolutions, within the scope of the invention it is essential that the number of loops per closed loop arrangement is established in relation to the other loop arrangements in a coprime manner relative to each other, so as to ensure bijective counting.

On further implementation of this principle of arranging multiple coprime loop structures, the applicant has already experimentally created loop arrangements that allow the bijective counting of 3465 revolutions, wherein the loop arrangements required to do so take up an area of only approximately 500 µm·600 µm. These small areas taken up by the sensor structures illustrate that an easy expansion of such loop structures for determining far more than 4000 revolutions is within the scope of the invention, since the dimensions of the outer magnetic field generators clearly exceed these dimensions.

Figure 5:
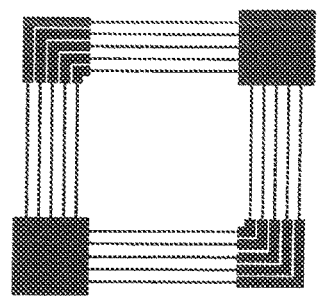
FIG. 5 shows a possible electrical contacting based on a quintuple loop structure.

FIG. 5 shows only by way of example how the manner of the contact connection can advantageously take place in a loop arrangement that is created in accordance with FIG. 4 (left quintuple loop), for example. The provided contacts, which are not denoted here in greater detail, are shown in bold in FIG. 5. The advantages of such a contacting type and the design of Wheatstone half bridges were already addressed in detail in DE 10 2008 063 226 A1. These findings and stipulations can also be completely applied to the present invention and are therefore not described in greater detail here.

As was already mentioned at the outset, the use of the proposed sensor is not exclusively directed to the counting of revolutions. The additional advantages that result from the use of the proposed sensor shall be illustrated based on the following comments:

Other applications take advantage of the fact that, above a linear or rotating arrangement of permanent magnets, in which neighboring permanent magnets are disposed rotated 180° in relation to each other, as indicated in FIG. 1c, a magnetic field having a constant magnitude forms at a constant distance from the arrangement of the permanent magnets, the direction of the magnetic field carrying out a rotation. When using a magnet wheel having exactly 2N permanent magnets in combination with an angle sensor that is able to measure an angle with a resolution of Δφ, the use of this angle sensor for measuring the direction of the magnetic field above the magnet wheel yields an angular resolution of Δφ/2N, which is a significant improvement in resolution that can be established via the number of permanent magnets. At the same time, the absolute angle position can be determined with the aid of a revolution counter, if the counter is designed to reach the starting position thereof after 2N revolutions. An arbitrary angle value can thus be calculated using the following formula:

$$\Omega=(n\cdot 360°+\varphi)/2N$$

where n is the number of counted revolutions of the magnetic field above the magnet wheel (0≤n<2N), and φ is the measuring angle of the angle sensor. The signal is thus periodic in 2N, and the resolution is improved by the factor 1/2N.

The following examples shall be mentioned here:

By combining a quintuple and quadruple loop arrangement according to the present invention, a magnet wheel having 20 individual permanent magnets can improve the resolution of a magnetic angle sensor from 0.2° to 0.01°, for example, and thus achieve the resolution of optical sensors.

Similar solutions result when a transition is intended from an incremental magnetic sensor to an absolute sensor. Incremental magnetic sensors or decoders are used to measure to distances in the mm to m range. Magnetic scales are used for this purpose, in which a typical so-called pole length of 2 mm is used. The combination of a magnetic angle sensor, which is able to determine the relative position within the 2 mm pole length with a precision to within a few µm, with a revolution counter, which counts the number of pairs of poles which the angle sensor passes, allows an absolute encoder to be created that has all the advantages over an incrementally operating length sensor. A sensor according to the invention, which counts to 500, for example, in combination with an incrementally operating magnetic sensor can then measure, in absolute terms, a distance of 1 m with a precision to within 1 µm, and detects any displacement, even in a state in which the sensor system is not supplied with electrical power (movement in a current-less case, such as in the event of a short circuit).

All features discernible from the description, the exemplary embodiments, and the following drawings can be essential to the invention to the invention, both individually and in any arbitrary combination with each other.

The invention claimed is:

1. A magnetic sensor for ascertaining absolute revolution or displacement values for bijective determination of a predefinable number of revolutions, or partial revolutions, or displacements, to be ascertained of an element that is driven to be rotated or displaced and is connected to a magnetic system and generates an anisotropic, external magnetic field, comprising a soft magnetic loop structure, which is populated with a predeterminable number of magnetic domains and provided with GMR or TMR layer assemblies and comprises at least a first conductor loop and a second conductor loop arranged one within the other in a common plane and each predominantly comprising straight subsections arranged in a substantially rhombus-shape and connected to each other via a shared intersecting point, wherein in a region directly in front of the intersecting point, in which and after which the domains can change from one of said loops to an adjacent said loop, loops further comprise sections bent away from the straight subsections contiguous therewith and wherein the bent sections of the loops form the conductors into siphon-shape troughs directed into an interior of the loop structure, where the conductors intersect perpendicularly at the respective siphon-shaped troughs.

2. The magnetic sensor according to claim 1, wherein the bending is at angles >45° and less than 90°.

3. The magnetic sensor according to claim 1, wherein in a region of the conductors in which the respective siphon-shaped troughs intersect perpendicularly, length of the conductors is approximately three times width of the conductors.

4. The magnetic sensor according to claim 1, width of each of the siphon-like troughs is between 0.5 µm and 10 µm.

5. A magnetic sensor according to claim 1, comprising at least three of the loops which are connected to each neighboring loop via respective bent sections in the form of siphon-shaped troughs.

6. The magnetic sensor according to claim 1, comprising more than two of said loop structures, which among each other are connected to each other via respective loop sections in the form of a siphon-shaped troughs, wherein a different number of such respective closed loop structures having mutually separated conductors for domain guidance are provided in closely neighboring positions in one plane, the loop structures not all having a same number of loops.

7. The magnetic sensor according to claim 6, wherein the selection of number of loops in one of the closed loop structures relative to number of loops in another of the closed loop structures is coprime.

8. The magnetic sensor according claim 1, wherein the intersections (K) are disposed opposite each other on a diagonal in a rhombus-shaped closed loop structure that contains more than two intersecting loops.

9. The magnetic sensor according to claim 2, wherein the bending angle is less than 55°.

10. The magnetic sensor according to claim 1, comprising at least a third conductor loop, wherein the intersection of each of the loops with an adjacent loop is diagonally across said rhombus-shape of the loop from the intersection of the adjacent loop with the next adjacent loop.

* * * * *